(12) United States Patent
Yang et al.

(10) Patent No.: US 7,514,359 B2
(45) Date of Patent: Apr. 7, 2009

(54) ADHERING LAYERS TO METALS WITH DIELECTRIC ADHESIVE LAYERS

(75) Inventors: Yang Yang, Gillette, NJ (US); Chun-Ting Liu, Hsin-chu (TW); Rose Kopf, Green Brook, NJ (US); Chen-Jung Chen, Berkeley Heights, NJ (US); Laylay Chua, Cambridge (GB)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 287 days.

(21) Appl. No.: 11/184,232

(22) Filed: Jul. 19, 2005

(65) Prior Publication Data
US 2005/0255692 A1    Nov. 17, 2005

Related U.S. Application Data

(62) Division of application No. 10/341,777, filed on Jan. 14, 2003, now Pat. No. 6,989,579.

(51) Int. Cl.
*H01L 21/44* (2006.01)

(52) U.S. Cl. .................. 438/654; 257/753; 257/E23.16
(58) Field of Classification Search ................ 438/628, 438/644, 654; 257/640, 753
See application file for complete search history.

(56) References Cited

U.S. PATENT DOCUMENTS

| 4,097,889 | A | | 6/1978 | Kern et al. |
| 5,416,356 | A | * | 5/1995 | Staudinger et al. .......... 257/531 |
| 6,080,655 | A | | 6/2000 | Givens et al. |
| 6,248,655 | B1 | | 6/2001 | Machida et al. |
| 6,271,593 | B1 | | 8/2001 | Givens et al. |
| 6,429,518 | B1 | * | 8/2002 | Endo .......................... 257/753 |
| 2004/0113542 | A1 | * | 6/2004 | Hsiao et al. ................. 313/504 |

* cited by examiner

*Primary Examiner*—Alexander G Ghyka
*Assistant Examiner*—Reema Patel

(57) ABSTRACT

The present invention provides a method for adhering dielectric layers to metals, in particular inert metals, using an adhesive layer comprising silicon-rich silicon nitride. Good adhesion is achieved at temperatures of less than 300° C., thereby facilitating the fabrication of semiconductor structures containing II-VI and III-V semiconductors.

11 Claims, 5 Drawing Sheets

ADHERING LAYERS TO METALS WITH DIELECTRIC ADHESIVE LAYERS

CROSS-REFERENCE TO RELATED APPLICATION

This Application is a Divisional of application Ser. No. 10/341,777 filed on Jan. 14, 2003, now U.S. Pat No. 6,989,579. The above-listed Application is commonly assigned with the present invention and is incorporated herein by reference as if reproduced herein in its entirety.

TECHNICAL FIELD OF THE INVENTION

The present invention is directed, in general, to II-VI and III-V compound semiconductors, and more specifically the adhesion insulating layers to inert metals.

BACKGROUND OF THE INVENTION

In high speed device applications of the microelectronic and telecommunication industries, II-VI and III-V compound semiconductor materials offer a number of advantages over devices based on silicon semiconductors. For instance, the high electron mobility of III-V substrates, such as Indium Phosphide (InP) or Indium Gallium Arsenide (INGaAs) are advantageous in the high speed active device structures used in optical fiber communication applications that include passive device components, such as metal-insulator-metal capacitors. Also, the wide band gap properties of II-VI and III-V semiconductor materials have high break-down voltages that make them useful in modulator driver applications in optoelectronic devices.

The broad application of II-VI and III-V compound semiconductors in such devices has been problematic, however. One of the problems encountered, for example, is poor adhesion between capacitor insulating layers, comprising high dielectric constant materials, such as silicon nitride, and conducting layers comprising inert metals, including noble metals, such as gold, palladium or platinum. In comparison, for silicon-based semiconductors, there is better adhesion between insulating layers, such as silicon oxide, and conducting layers comprising non-inert metals, such as aluminum or copper. On the other hand, noble metals are preferred because such metals do not readily diffuse into II-VI or III-V materials and damage the semiconductor structure.

Previously proposed solutions to improve adhesion between insulating layers and conducting layers comprising inert metals are not satisfactory. Consider, for example, a metal-insulator-metal capacitor where the insulator is a dielectric material, such as conventional silicon nitride ($Si_3N_4$), and the upper and lower metal are inert metals, such as a noble metals. Typically, to promote adhesion of the insulator to the inert metal via metal adhesion, thin layers of metal, such as titanium or chromium are deposited between the insulator and the inert metal layers. The use of titanium as an adhesion promoter is problematic, for example, because titanium is readily oxidizable. Oxidation typically occurs during the transfer of a structure having titanium as the adhesion promoter from the tool for depositing the metal to the tool for depositing the insulating layer. Moreover, titanium oxides are not easily removed, requiring transfer to a separate tool for removal thus interfering with forming capacitors using noble metals. Chromium is not a good candidate adhesion promoter because chromium can act as a n-type dopant that readily diffuses into III-V materials.

Silicon nitride is known to adhere well to inert metals when deposited at temperatures of 300° C. or higher. Many II-VI and III-V compound semiconductors, however, must be kept at temperatures of less than 300° C. to avoid dissociation of the integrated substrate comprising, layers grown by Molecular Beam Epitaxy, for example, metal contact layers, and overlaying components. At such low temperatures, however, silicon nitride does not deposit on inert metals in a manner that allows acceptable adhesion.

Accordingly, an objective of the invention is a process for adhering inert metals to insulating and semiconductor layers without encountering the above-mentioned difficulties.

SUMMARY OF THE INVENTION

To address the above-discussed deficiencies, one embodiment of the present invention provides a method of manufacturing a semiconductor device. The method includes depositing a metal layer over a semiconductor substrate, depositing an adhesive layer on the metal layer, and depositing a dielectric layer on the adhesive layer. The adhesive layer comprises silicon-rich silicon nitride while the dielectric layer has a lower stoichiometric silicon content than the adhesive layer.

Another embodiment of the invention is a semiconductor structure comprising a substrate, a metal layer over the substrate, and the above-described adhesive layer on the metal layer, and the above described dielectric layer on the adhesive layer.

Yet another embodiment of the present invention is an integrated circuit. The integrated circuit comprises a bipolar transistor, that includes a collector, a base, and emitter on a semiconductor substrate, and a capacitor located over the semiconductor substrate. The capacitor includes a metal layer located over the semiconductor substrate, the above-described adhesive layer on the metal layer, the above-describe dielectric layer on the adhesive layer, and a second metal layer over the dielectric layer.

BRIEF DESCRIPTION OF THE DRAWINGS

The invention is best understood from the following detailed description, when read with the accompanying FIGURES. Various features may not be drawn to scale and may be arbitrarily increased or reduced for clarity of discussion. Reference is now made to the following descriptions taken in conjunction with the accompanying drawings, in which.

DETAILED DESCRIPTION

The present invention recognizes the advantageous use of a silicon rich adhesive layer to adhere a dielectric layer to a metal layer, in particular an inert metal layer. It has been found that good adhesion can be achieved without raising the temperature above about 300° C. Such low temperature adhesion facilitates the fabrication of the semiconductor device with lower defect rates and longer functional life.

Figure 1A:
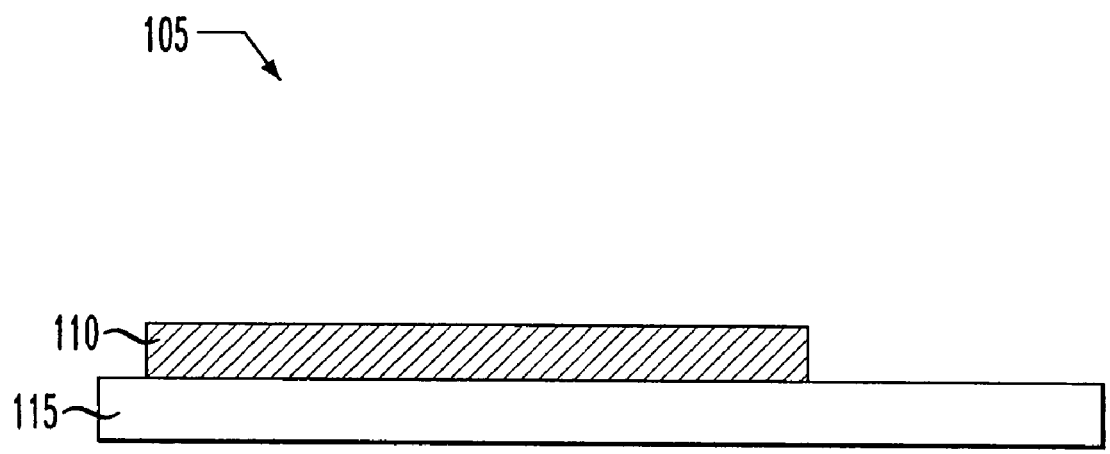
FIGS. 1A-1C illustrate sectional views of the device covered by the present invention at various stages of manufacture.
Figure 1B:
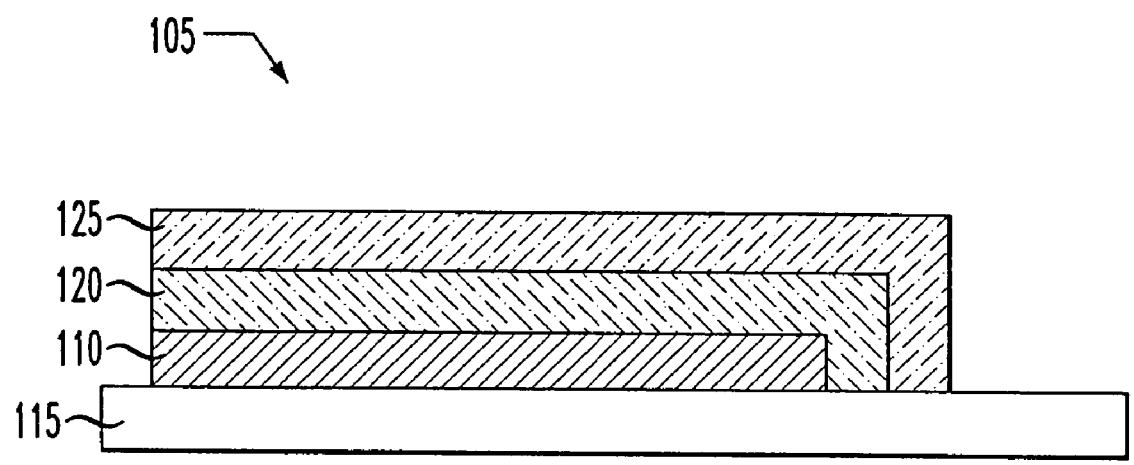
Figure 1C:
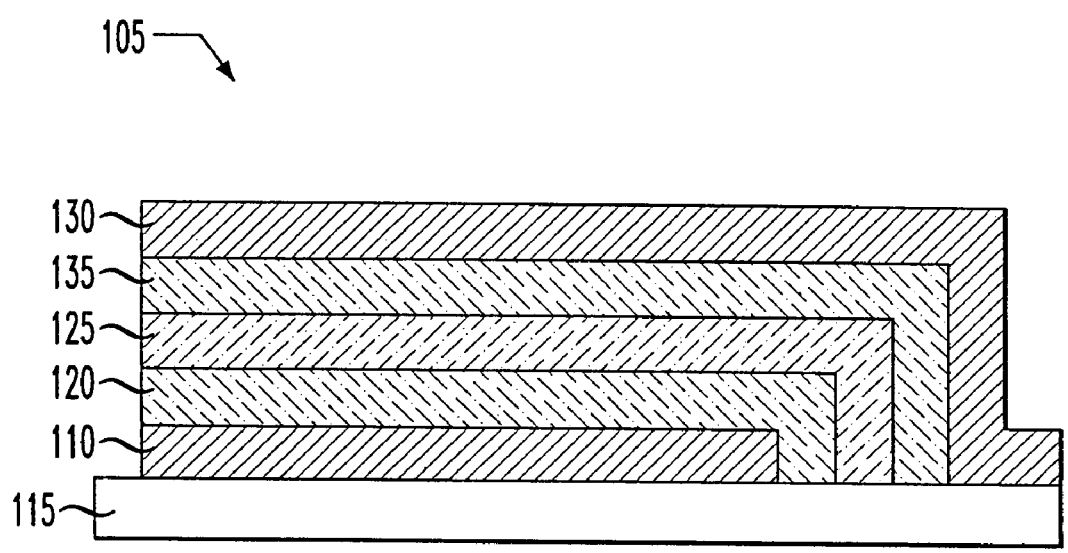

FIGS. 1A-1C illustrate sectional views of a device 105 covered by the present invention at various stages of manufacture. As illustrated in FIG. 1A, a metal layer 110 is located over a semiconductor substrate 115. The metal layer 110 may be a noble metal, such as gold, palladium, platinum or combinations thereof. Conventional deposition processes, such as physical vapor or chemical vapor deposition, electron beam evaporation and sputtering, may be used to deposit the metal layer 110 on the substrate 115. In an advantageous embodiment, the semiconductor substrate 115 comprises Group II and IV or Group III and V elements from the Periodic Table of the Elements. In certain preferred embodiments, for example, the semiconductor substrate 115 may be indium phosphide. In other embodiments however, the substrate 115 could comprise silicon, or combinations of silicon and Group II and IV or Group III and V elements.

As shown in FIG. 1B an adhesive layer 120 of silicon-rich silicon nitride is deposited on the metal layer 110. The term silicon-rich silicon nitride as used herein refers to any silicon nitride material having a stoichiometric silicon to nitrogen ratio that is greater than conventional silicon nitride ($Si_3N_4$), i.e., greater than about 0.75. Preferably, the adhesive layer 120 comprises a dielectric material having a stoichiometric ratio of silicon to nitrogen of greater than about 1, and more preferably between about 1.2 and about 1.5. Conventional deposition processes may also be used to deposit or form the silicon-rich adhesive layer 120 on the metal layer 110. In an advantageous embodiment a conventional dielectric layer 125 may also be deposited over or on the adhesive layer 120. In certain preferred embodiments of the device 105, the adhesive layer 120 is at least about 20 Angstroms thick, and more preferably between about 50 Angstroms and about 200 Angstroms thick.

The dielectric material 125 may be any conventional material used in the semiconductor industry as insulator or semiconductor materials. For example, the dielectric material 125 may comprise silica glass, and more preferably conventional silicon nitride ($Si_3N_4$). The adhesive layer 120 of silicon-rich silicon nitride, however, is most advantageously used to adhere less reactive metals, or alloys of inert metals and reactive metals, to the dielectric layer 125, such as those previously noted above. However, noble metals, such as palladium or platinum, are more preferred because such metals do not readily diffuse into II-VI or III-V semiconductor substrates 115 and damage the semiconductor structure 105.

The greater adhesive properties afforded by the silicon-rich adhesive layer 120 is combined with the advantages of having an insulating layer, comprising the dielectric layer 125, that allows the device 105, when configured as a capacitor, for example, to have a constant capacitance over a range of applied voltage. For example, for a ratio of silicon to nitrogen of between about 1.2 and about 1.5, the capacitance varies by less than about 0.5 percent over an applied voltage range of from about −10 Volts to about +10 Volts. If the ratio of silicon to nitrogen exceeds about 2, then there is increased leakage of carriers out of the silicon-rich layer 120 so as to detrimentally affect the insulating properties of the dielectric layer 125. Insulating layers that are silicon-rich, for example, do not have a constant capacitance with applied voltage.

As noted above, it was discovered that adhesive layers comprising silicon-rich silicon nitride 120 are excellent adhesion promoters, even when deposited at temperatures below about 300° C. It is advantageous therefore to deposit the adhesive layer 120 at a temperature of about 200° C. or less, and more advantageously about 90° C. or less, using otherwise well known deposition techniques.

The high silicon content of the adhesive layer 120 may be assessed by any number of techniques well known to those skilled in the art. Secondary ionization mass spectroscopy or Auger spectroscopy, for example, may be used to assess the relative proportions of silicon and nitrogen in the layer 120. Alternatively, laser ellipsometry may used to non-destructively monitor the silicon and nitrogen content of the layer 120. Another way to monitor the silicon content of silicon nitride is to measure the refractive index of the silicon nitride sample of interest. Conventional silicon nitride ($Si_3N_4$), for example, has a refractive index of about 1.9 to about 2.0. The silicon-rich adhesive layer 120 of the present invention, on the other hand, has a higher refractive index. Preferably, the adhesive layer 120 has a refractive index of between about 2.3 to about 2.7 at a wavelength of about 632 nm.

Turning now to FIG. 1C, the method of making the semiconductor device 105 may further include depositing a second metal layer 130, over the dielectric layer 125. The second metal layer 130 may comprise the same classes of metals as described for the metal layer 110. In such embodiments, the metal layers 110 and 130 can serve as electrodes for a capacitor. In another embodiment, however, the device 105 may also include an optional second silicon-rich silicon nitride adhesive layer 135 located between the dielectric layer 125 and the second metal layer 130.

Figure 2:
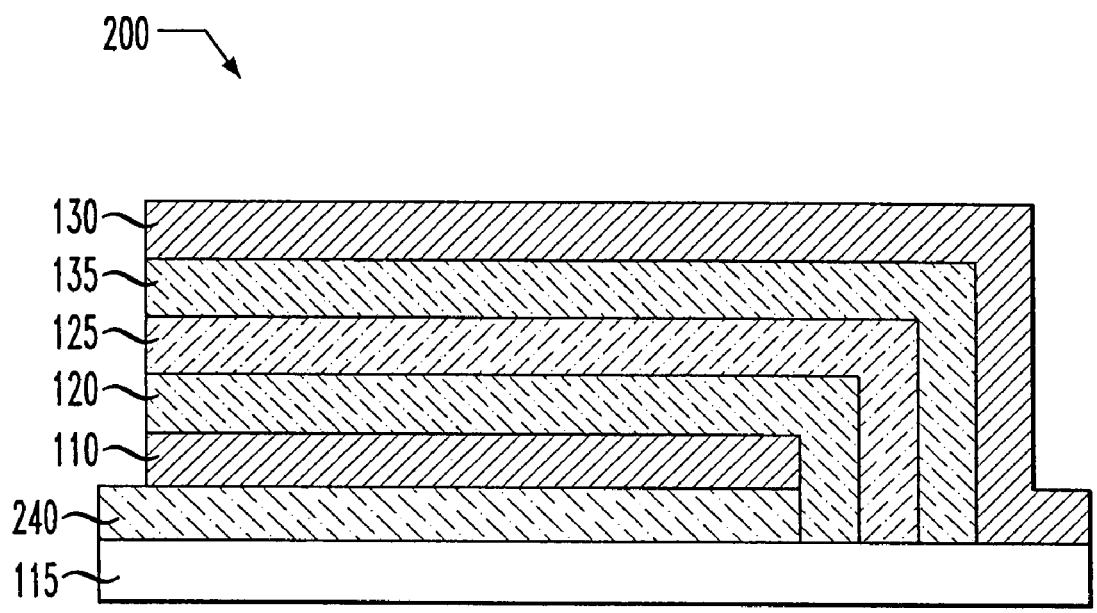
FIG. 2 schematically illustrates a sectional view of a portion of a semiconductor structure of the present invention.

Turning now to FIG. 2, there is illustrated an alternative embodiment of the device illustrated in FIGS. 1A-1C, which is generally designated 200. As before, the device 200 may include layers 110, 120, 125, 135 and 130 as previously discussed with respect to the device illustrated in FIGS. 1A-1C, including its alternative embodiments. In addition, however, the device 200 further includes an adhesive layer 240 between the substrate 115 and the metal layer 110." The adhesive layer 240 may comprise a silicon-rich silicon nitride, similar to that described above. In alternative embodiments, however, the adhesive layer 240 may comprise a metallic adhesive comprising transition metals, such as titanium, palladium, tungsten, chromium or mixtures thereof. As shown, the device 200 can serve as a capacitor in an integrated circuit that includes, for example, a heterojunction bipolar transistor (HBT), a field effect transistor (FET) device or combinations thereof.

Figure 3:
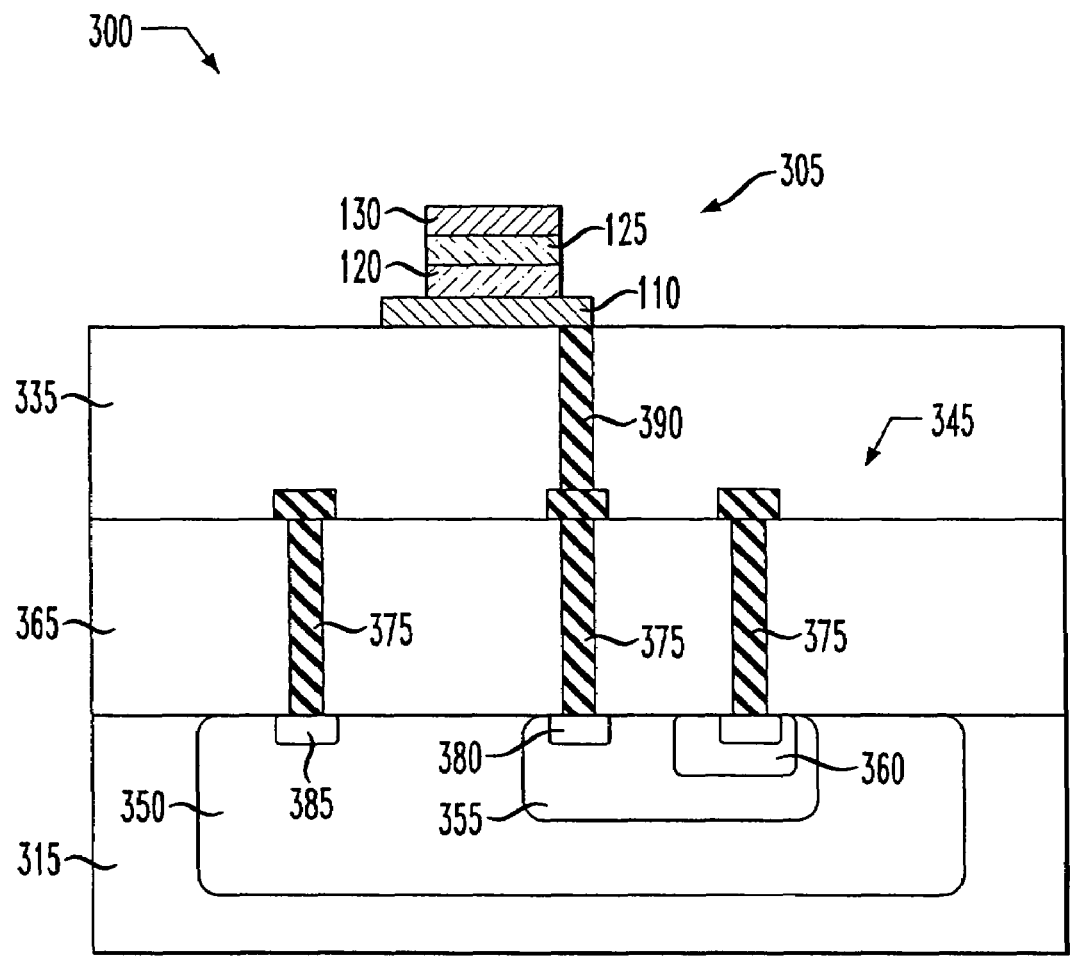
FIG. 3 schematically illustrates a sectional view of a portion of an integrated circuit incorporating the device of the present invention.

FIG. 3 illustrates yet another embodiment of the present invention, an integrated circuit 300 that incorporates a device as provided by the present invention and similar to that discussed above. The integrated circuit 300 includes a capacitor 305 located over a semiconductor substrate 315. In this particular embodiment, the capacitor 305 is located on a conventional dielectric layer 335. However, it should be understood that the capacitor 305 may be located at other levels within the integrated circuit 300, if so desired. The capacitor 305 comprises the metal layer 110 or first electrode located on the dielectric layer 335, the silicon-rich adhesive layer 120, the dielectric layer 125, and a second metal layer 130 or second electrode located over the dielectric layer 125. The bipolar transistor 345 may be conventional in design and in such embodiments includes a collector 350, a base 355, and emitter 360 on the semiconductor substrate 315. Examples of preferred bipolar transistors 345 include single and double hetrojunction bipolar transistors. The bipolar transistor 345 is insulated from upper metal levels by a dielectric layer 365 and the dielectric layer 335. In addition, interconnections 375, contact the base contact 380, collector contact 385 and emitter 360 and interconnection 390 ultimately connects the capacitor 305 to the bipolar transistor 345. It should also be appreciated that other interconnections, which are not shown, interconnect the bipolar transistor 345 and other active or passive device structures that might exist within the integrated circuit 300 to form an operative integrated circuit 300.

Although the present invention has been described in detail, those of ordinary skill in the art should understand that they can make various changes, substitutions and alterations herein without departing from the scope of the invention.

What is claimed is:

1. A method of manufacturing a semiconductor structure, comprising:
   depositing a metal layer over a semiconductor substrate;
   depositing an adhesive layer of silicon-rich silicon nitride on said metal layer; and
   depositing a dielectric layer, having a lower stoichiometric silicon content than said adhesive layer, on said adhesive layer, wherein said metal layer is a plate in a capacitor, and wherein said adhesive layer has a refractive index of between about 2.3 and about 2.7 at a wavelength of about 632 nm and said adhesive layer comprises a dielectric material having a stoichiometric ratio of silicon to nitrogen of between about 1.2 and about 1.5.

2. The method as recited in claim 1, wherein said adhesive layer comprises a silicon nitride having a stoichiometric ratio of silicon to nitrogen of greater than about 1.

3. The method as recited in claim 1, wherein depositing said adhesive layer is performed at a temperature of about 200° C. or less.

4. The method as recited in claim 1, wherein said depositing of said adhesive layer is performed at a temperature of about 90° C. or less.

5. The method as recited in claim 1, wherein said dielectric layer comprises a compound selected from the group consisting of:
   silicon nitride; and
   silica glass.

6. The method as recited in claim 1, wherein said metal is an inert metal selected from the group of noble metals consisting of:
   gold;
   palladium; and
   platinum.

7. The method as recited in claim 1, wherein said semiconductor substrate comprises elements from Groups II and IV or from Groups III and V of the Periodic Table of Elements.

8. The method as recited in claim 1, further including depositing a second metal layer over said dielectric layer, wherein a second silicon-rich silicon nitride adhesive layer is located between said second metal layer and said dielectric layer, and said second metal layer is a second plate of said capacitor.

9. The method as recited in claim 1, wherein said adhesive layer of silicon rich silicon nitride has a ratio of silicon to nitrogen that does not exceed about 2:1.

10. A method of manufacturing a semiconductor structure, comprising:
    depositing a metal layer over a semiconductor substrate;
    depositing an adhesive layer of silicon-rich silicon nitride on said metal layer; and
    depositing a dielectric layer, having a lower stoichiometric silicon content than said adhesive layer, on said adhesive layer, wherein said metal layer is a plate in a capacitor, and wherein
    said adhesive layer has a refractive index of between about 2.3 and about 2.7 at a wavelength of about 632 nm, and
    said adhesive layer is a metallic adhesive layer comprises said silicon-rich silicon nitride and transition metals.

11. The method as recited in claim 10, wherein said transition metals comprise titanium, palladium, tungsten, chromium or mixtures thereof.

* * * * *